(12) United States Patent
Tekletsadik

(10) Patent No.: US 7,375,933 B2
(45) Date of Patent: May 20, 2008

(54) HIGH VOLTAGE DESIGN STRUCTURE FOR HIGH TEMPERATURE SUPERCONDUCTING DEVICE

(75) Inventor: Kasegn D. Tekletsadik, Rexford, NY (US)

(73) Assignee: SuperPower, Inc.

( * ) Notice: Subject to any disclaimer, the term of this patent is extended or adjusted under 35 U.S.C. 154(b) by 188 days.

(21) Appl. No.: 11/443,735

(22) Filed: May 31, 2006

(65) Prior Publication Data

US 2007/0023680 A1 Feb. 1, 2007

Related U.S. Application Data

(60) Provisional application No. 60/694,217, filed on Jun. 27, 2005.

(51) Int. Cl.
*H02H 9/02* (2006.01)

(52) U.S. Cl. .......................... 361/19; 361/21; 505/850; 505/883; 505/885; 505/875

(58) Field of Classification Search ............. 250/505.1; 361/19, 21; 505/850, 883, 885, 875
See application file for complete search history.

(56) References Cited

U.S. PATENT DOCUMENTS

| | | | | |
|---|---|---|---|---|
| 4,705,918 | A | * | 11/1987 | Harmon ..................... 174/73.1 |
| 5,488,199 | A | * | 1/1996 | Selsing et al. ............. 174/73.1 |
| 5,617,280 | A | * | 4/1997 | Hara et al. .................... 361/19 |
| 2005/0099253 | A1 | * | 5/2005 | Bock et al. .................. 335/100 |

OTHER PUBLICATIONS

P.E. Frayssines, et al. "Prebreakdown phenomena at high voltage in liquid nitrogen and comparison with mineral oil" IEEE Trans. on Dielectrics and Electrical Insulation, vol. 9, n 6 pp. 899-909 2002.*
P.E. Frayssines, et al. "Prebreakdown phenomena under uniform field in liquid nitrogen and comparison with mineral oil" IEEE Trans. on Dielectrics and Electrical Insluation, vol. 10, n 6 pp. 970-976 2003.*
P.E. Frayssines, O. Lesaint, N. Boniface, A. Dent, S. Lelaidier & F. Devaux "Prebreakdown Phenomena at High voltage in Liquid Nitrogen and Comparison with Mineral Oil", IEEE Trans. on Dielectrics and Electrical Insulation., vol. 9, n 6, pp. 899-909, 2002.
P.E. Frayssines, O. Lesaint, N. Bonifaci, A. Denat, F. Devaux, "Prebreakdown and Breakdown Phenomena Under Uniform Field in Liquid Nitrogen, and Comparison with Mineral Oil", IEEE Trans. on Dielectrics and Electrical Insulation., vol. 10, n 6, pp. 970-976, 2003.

* cited by examiner

*Primary Examiner*—Jack I. Berman
*Assistant Examiner*—Michael Maskell
(74) *Attorney, Agent, or Firm*—George L. Rideout, Jr.

(57) ABSTRACT

In accordance with the present invention, modular corona shields are employed in a HTS device to reduce the electric field surrounding the HTS device. In a exemplary embodiment a fault current limiter module in the insulation region of a cryogenic cooling system has at least one fault current limiter set which employs a first corona shield disposed along the top portion of the fault current limiter set and is electrically coupled to the fault current limiter set. A second corona shield is disposed along the bottom portion of the fault current limiter set and is electrically coupled to the fault current limiter set. An insulation barrier is disposed within the insulation region along at least one side of the fault current limiter set. The first corona shield and the second corona shield act together to reduce the electric field surrounding the fault limiter set when voltage is applied to the fault limiter set.

18 Claims, 5 Drawing Sheets

HIGH VOLTAGE DESIGN STRUCTURE FOR HIGH TEMPERATURE SUPERCONDUCTING DEVICE

CROSS REFERENCE TO RELATED APPLICATIONS

This US non-provisional application claims the benefit of U.S. provisional Patent Application, Ser. No. 60/694,217 entitled "High Voltage Design Structure For High Temperature Superconducting Device," filed on Jun. 27, 2005, having at least one co-inventor in common with this application.

LICENSE

The U.S. government has a paid-up license in this invention and the right in limited circumstances to require to the patent owner to license others on reasonable terms as provided for in the terms of Contract No. DE-FC36-03G013033 awarded by the Department of Energy and Contract No. EP-P 10361/C5273.

BACKGROUND

The invention relates generally to a cryogenic dielectric environment for high temperature superconductor (HTS) devices and more particularly to high voltage structures in a cryogenic dielectric environment for an electrical power system.

As the need for higher power and higher voltage applications of Superconducting devices increases, designing high voltage devices in a cryogenics dielectric environment becomes a challenge. The cryogenic dielectric systems are not yet well understood as viable insulation systems for high voltage applications. Conventional high voltage devices such as high voltage cables have employed corona shields to control electrical field stress, however, electrical corona shield solutions have not been employed in a cryogenic environment For example, U.S. Pat. No. 4,705,918 teaches the use of a corona shield assembly connected to various portions of a transmission line subassembly having two sets of oppositely mounted corona shields, where each corona shield is bolted directly to a portion of the transmission line subassembly such that the corona shield extend substantially over the subassembly portion of the transmission line. This patent does not teach or disclose the use of a corona shield in a cryogenic environment.

Use of corona shields in test equipment has been described, for example, in the publication, "Pre-breakdown and breakdown phenomena in liquid nitrogen at high voltage, comparison with mineral oil", O. Lesaint et. al., Workshop on Cryogenic Dielectrics, published Oct 16, 2005, Nashville Tenn. Intermediate plate insulation has also been disclosed in publications presented by the University of Southampton and KFK, O. Lesaint et. al., at the Workshop on Cryogenic Dielectrics, Oct 16, 2005, Nashville Tenn.

In another example, U.S. Pat. No. 5,488,199 teaches the use of an electrical stress controlled solid dielectric cable termination assembly having an electrical stress control device, which comprises a metal conductor shaped to achieve an electrical stress control function. A durable material having a high dielectric strength is applied as a coating to the exposed surfaces of the conductor. The coatings prevent conductive particles or contaminants, which may be present in an insulating fluid medium from directly contacting the stress control device. A corona shield is formed from a modified cylindrically shaped metal conductor. A partially conductive shield layer of the cable is properly terminated in an electrical stress reducing configuration by applying a partially conductive sleeve pre-finished in the desired shape to overlap the shield layer. This patent does not teach or disclose the use of a corona shield in a cryogenic environment. There is therefore a need to apply corona shield technology in cryogenic dielectric applications.

BRIEF DESCRIPTION

Briefly, in accordance with the present invention, modular corona shields, or also referred to as Stress Shields, are employed in a high temperature superconductor system to reduce the electric field surrounding the assembly of high temperature superconducting elements and associated components, known as the High Temperature Superconducting (HTS) device. In an exemplary embodiment a high temperature HTS system has at least one HTS device in the insulation region of a cryogenic cooling system which employs a first corona shield disposed along the top portion of the HTS device and is electrically coupled to the HTS device. A second corona shield is disposed along the bottom portion of the HTS device and is electrically coupled to the HTS device. An insulation barrier is disposed within the insulation region along at least one side of the HTS device. The first corona shield and the second corona shield act together to reduce the electric field stress surrounding the HTS device when energized at high voltage.

In another exemplary embodiment of the present invention, a high voltage fault current limiter (FCL) system comprises a plurality of FCL sets, wherein each FCL set consists of at least one corona shield disposed along the top portion and a corona shield along the bottom portion of the FCL set which are both electrically coupled to the FCL set. An insulation barrier is disposed along at least one side of the FCL set, wherein the corona shields act to reduce the electric field surrounding the FCL sets when energized. A bottom corona shield is coupled to adjacent FCL sets disposed along the bottom of the isolation barrier and is electrically coupled in series between two FCL sets.

DRAWINGS

These and other features, aspects, and advantages of the present invention will become better understood when the following detailed description is read with reference to the accompanying drawings in which like characters represent like parts throughout the drawings, wherein.

DETAILED DESCRIPTION

The invention addresses the high voltage design challenges within a cryogenic dielectric medium. The invention uses a high voltage design that improves the dielectric performance to reduce the electric field stress in all parts of the insulation regions by using corona shields and by using solid insulators to partition the gas or liquid dielectric regions.

Figure 1:
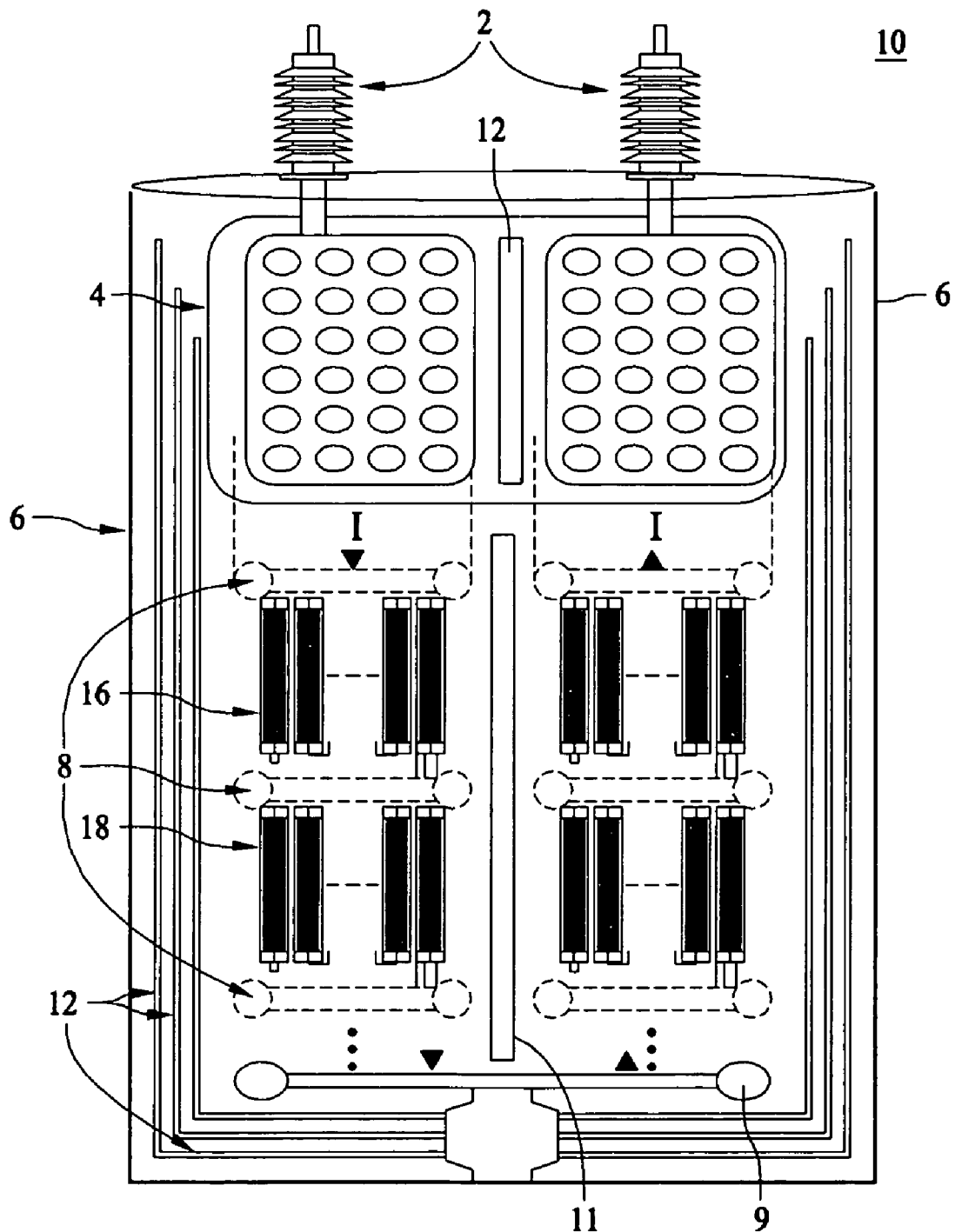
FIG. 1 is an illustration of the stress ring layout in a cryogenic system of the present invention.

FIG. 1 illustrates the layout of corona shields in a high voltage fault current limiter system 10 of the present invention. A first corona shield 8 is disposed along the top portion of a FCL set 16 and is electrically coupled to the FCL set 16. A second corona shield 8 is disposed along the bottom portion of the FCL set 16 and is electrically coupled to the FCL set 16. The arrangement of the FCL set 16 and the two corona shields is a first fault current limiter module (FCLM). FCL set 16 comprises at least one fault current limiter, and in a preferred embodiment a plurality of fault current limiters. The second corona shield 8 is further disposed along the top portion of another fault current limiter set 18 which is identical to fault current limiter set 16 and is electrically coupled to the second corona shield 8. A third corona shield 8 is disposed along the bottom portion of fault current limiter 18 and is electrically coupled to fault current limiter 18. Each corona shield 8 has a surface area that may extend beyond the area defined by the ends of all fault current limiters within fault current limiter set 16. This arrangement is repeated for each additional module for "n" modules in a cryogenic cooling system, or cryostat 6. A bottom corona shield 9 is disposed along the lower portion of the insulation barrier within the cryostat 6. The surface area of corona shield 9 is sufficient to extend beyond the surface area of all adjacent fault current limiter module ends facing the bottom portion of the cryostat 6.

Figure 2:
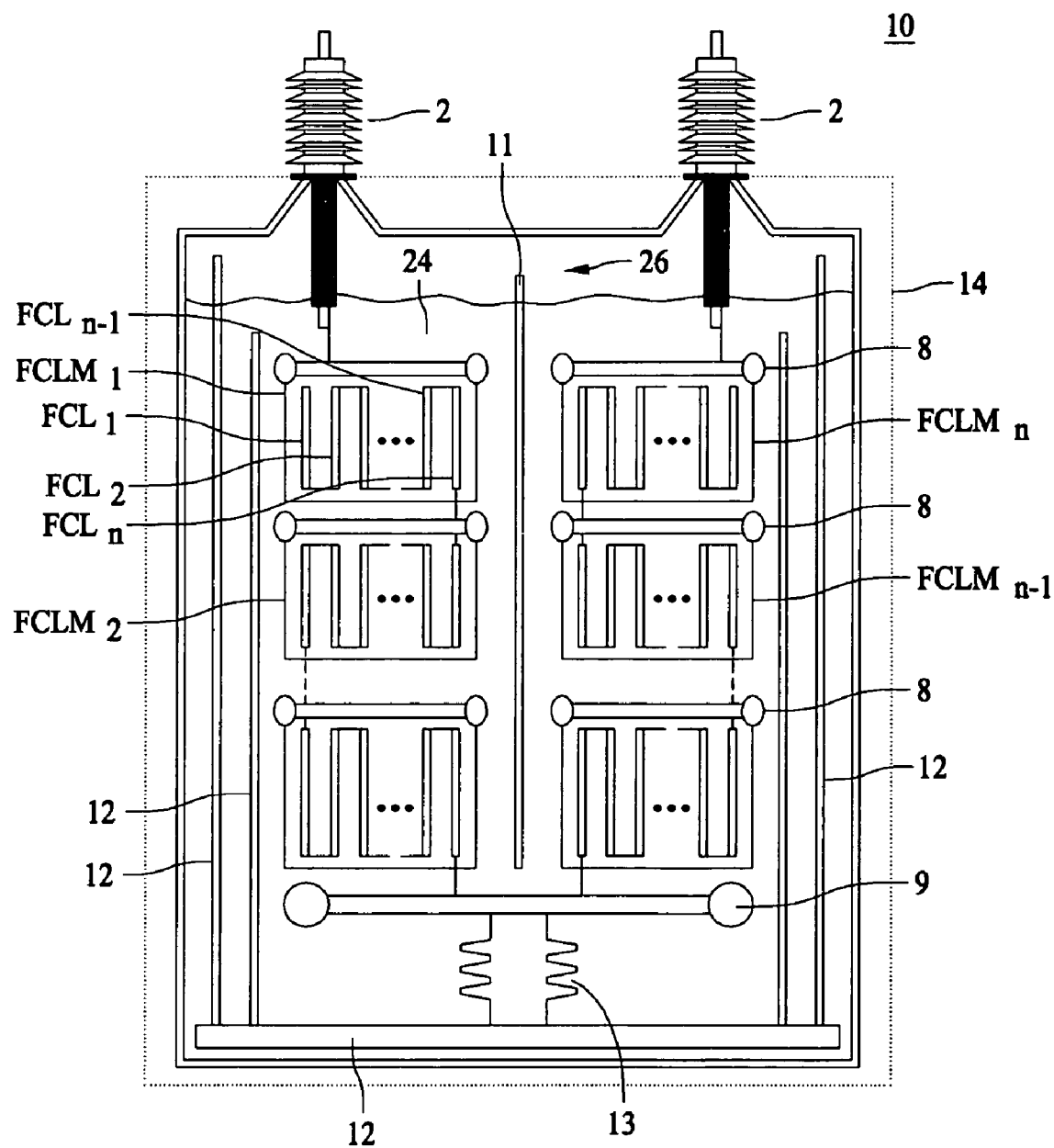
FIG. 2 is an illustration of an alternative embodiment of the stress ring layout of the present invention.

FIG. 2 is a more detailed illustration of the high voltage HTS system 10 of FIG. 1. Fault Current Limiter Modules $FCLM_{1-n}$ comprises fault current limiter sets 16 and 18. There is "n" FCL Modules in HTS system 10, as illustrated by $FCLM_1$ through $FCLM_n$. Each FCLM comprises at least one fault current limiter $FCL_1$ through $FCL_n$ all electrically coupled in series. Insulation barrier 12 is disposed around the inner surface of cryostat 6. Insulation barrier 12 has at least two sections along the side walls of cryostat 6, one section extending about the surface level of the cooling liquid and the other section below the surface level of the cooling liquid. In an exemplary embodiment the cooling liquid is liquid nitrogen and the insulation barrier is G10. In principle the cooling liquid can be a any cryogenic liquid and the solid insulation can be any solid insulation compatible with cryogenics temperature, such as Teflon, PPLP, FRP and etc. The insulation barrier 12 is also disposed along the bottom portion of the cryostat 6 and is coupled to insulation barrier 12 along the cryostat sidewalls. Insulator 13 acts to maintain a minimum distance, depending on the system voltage, between insulator 12 and corona shield 9. An insulation barrier 11 is also disposed generally along the center portion of cryostat 6 between $FCLM_1$ and $FCLM_n$ to divide the FCLM sets into at least two groups, $FCLM_1$, $FCLM_2$, and $FCLM_{n-1}$, $FCLM_n$.

Each fault current limiter $FCL_1$ through $FCL_n$ in the present system may be a FCL comprising a superconducting element, such as BSCCO, YBCO or others, which has at least one high temperature superconductor element coupled in parallel with a shunt coil. The shunt coil is physically disposed around the HTS in such a way so that the magnetic field generated by the current in the coil is uniformly applied to the HTS. Under normal operating conditions, the superconducting element will have no resistance and thus essentially all the current will flow through it. Consequently, there is essentially no voltage drop across the whole arrangement and the parallel-connected shunt coil will have essentially no current flowing through it. Once there is a fault, however, the current surge will exceed the critical current level of the superconductor element and cause it to rapidly quench and become resistive, thus generating a sufficiently large voltage drop across the shunt coil which results in part of the overall current being diverted into the shunt coil. In one embodiment, the resulting current in the shunt coil may generate a magnetic field that is uniformly applied to the superconductor, which acts to further quench the superconductor uniformly. The shunt will also act to limit the voltage generated by the superconductor and share the total current to insure that the superconductor does not overheat and can quickly return to its normal state once the fault has been removed. The fault current limiter may also have a trigger coil electrically coupled in series or in parallel or a combination of series and parallel with the HTS element.

Corona shield 8 may have any form and in this exemplary embodiment corona shield 4 is rectangular with rounded edges. The corona shield 8 is made of aluminum, copper, brass, and any other metallic compound or semi conductive coating that is a conductor of electricity. Corona shield 8 may also be electrically insulated. The end portions of stress shield 8 have to be designed to have no or minimum sharp corners to avoid high electric field enhancement regions that may reduce the dielectric strength of the insulation system. In this exemplary embodiment the ends of corona shield 8 are circular. Corona shield 9 generally may be larger than corona shield 8 and has a surface area that is sufficient to cover all modules disposed adjacent to corona shield 9. Corona shield 9 is made of the same material as corona shield 8, has the same general shape of corona shield 8, and is electrically coupled in series with each of the modules adjacent to it.

Figure 3:
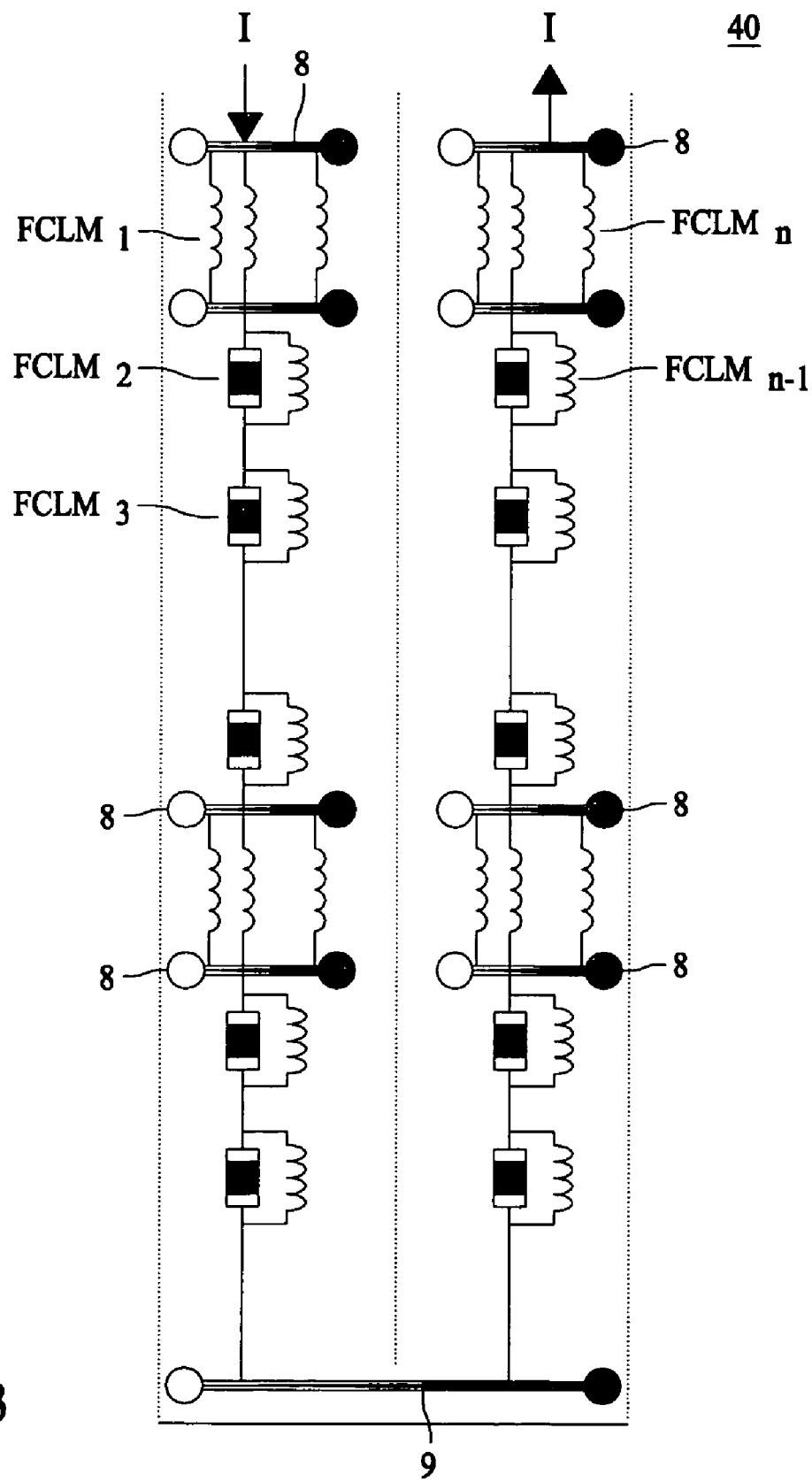
FIG. 3 is a further illustration of the electrical schematic arrangement of FCL set of the present invention.

FIG. 3 shows an electrical schematic of the present invention wherein at least one corona shield 8 is disposed at the top and at the bottom of a respective fault current limiter set 16 to form a FCLM. In cryogenic HTS system 10 there are "n" FCLM electrically coupled in series. A bottom corona shield 9 is coupled in series with each respective adjacent FCLM. Current "I" flows from $FCLM_1$ to $FCLM_n$.

Figure 5:
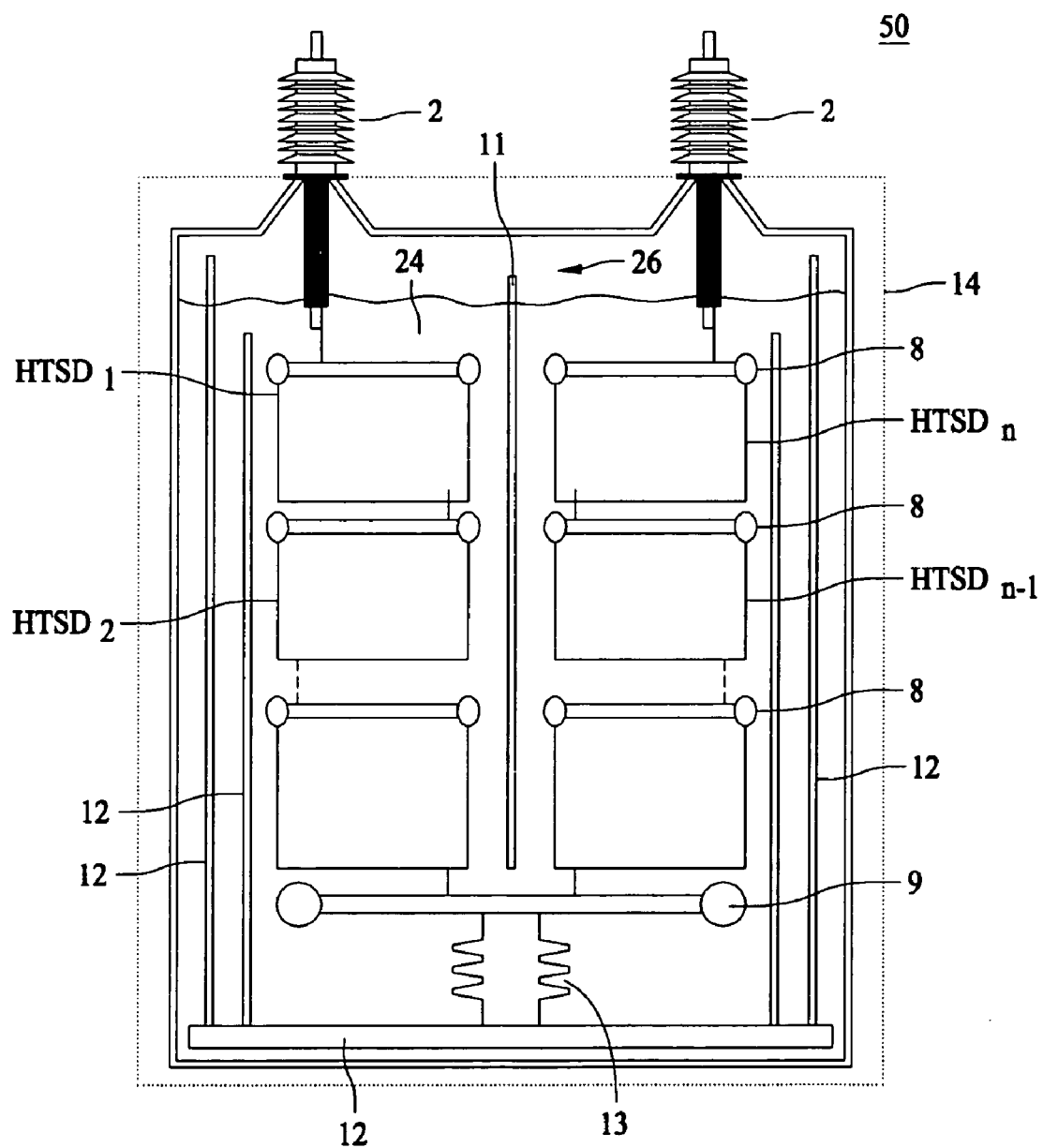
FIG. 5 is an illustration of an alternative embodiment of the corona shield layout employing high temperature superconducting devices of the present invention.

FIG. 5 is a more generalized alternative embodiment of the present invention wherein a high temperature superconductor device (HTSD) is substituted for the each of the FCL modules. HTS system 50 comprises $HTSD_1$ through $HTSD_n$ devices electrically coupled in series with electrical bushings 2. The FCLM is one exemplary embodiment of the HTSD and a Matrix type FCL is another exemplary embodiment of the HTSD. Generally, any device that acts in a high temperature superconducting environment, such as transformers, reactors, generators, motors and other power system devices, may be considered a HTSD. A plurality of corona shields 8 are disposed at the top and bottom of each HTSD. Corona shield 9 is electrically coupled in series with each of the HTS devices adjacent to it. In general the number and size of the corona shields required for a specific HTSD may be customized based on the requirements.

Figure 4:
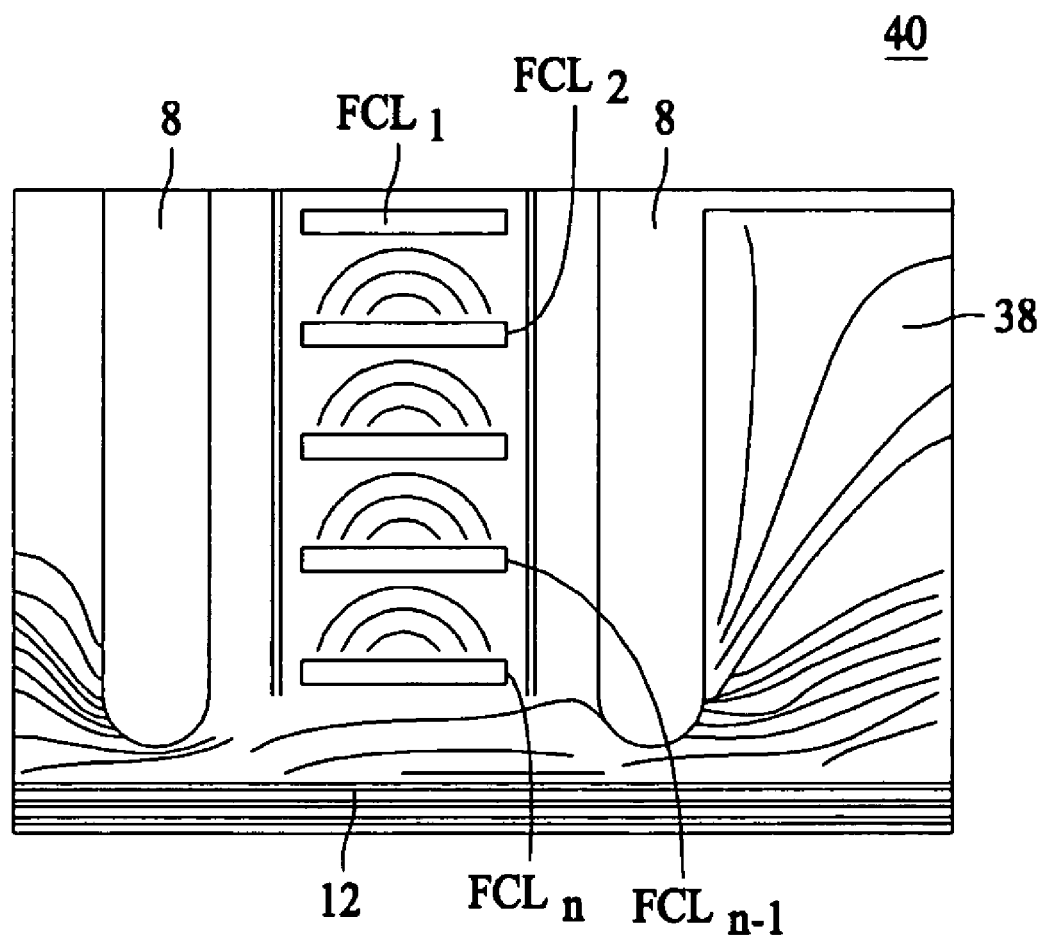
FIG. 4 is an equi-potential line plot of the high voltage potential around a FCL set of the present invention.

During operation of high voltage HTS system 10, such as normal operation, fault conditions or testing, high voltage is applied with respect to ground to each of the high voltage bushings 1 & 2, which are connected to the HTS devices or FCL Modules 1 though "n". . . . Depending on the applied voltage, corresponding voltages are also developed across each of the HTS devices. FIG. 4 is a plot of a computer simulation showing the results of high voltage distribution depicted by equi-potential lines 38 around FCL$_1$ through FCL$_n$ disposed between two modular corona shields 8 and adjacent to the cryostat wall during a fault condition. In this simulation the maximum voltage is 200 KV and the minimum voltage is zero volts. The voltage level is greatest along the surface area of FCLN and along the surface area of corona shield 8. The voltage level is least in the area surrounding $FCL_1$, the cryostat wall. Corresponding electric fields have a direct correlation to the voltage gradient levels within the dielectric regions. This simulation shows that corona shields disposed around the FCL modules act to reduce the electric field around each FCL and within the FCL modules in the present system.

The use of modular corona shields, made of conductor rings (bare or covered), reduces electric field stress and gives more uniform electric field distribution, in both external and internal insulation structures.

Benefits of the present invention include; better uniformity in voltage distribution for both AC and impulse voltage applications; smaller size $FCLM_{1-n}$ for ease of handling and modular testing; identical high voltage bushings 2 and a lead assembly design improves simplicity, manufacturing and testing; a symmetrical design and assembly within the cryostat; inner insulation shielded by corona shields to reduce electric field stress in an assembly with mostly metallic and sharp edge internal FCL structures; and multiple modules which reduces the AC or impulse voltage drop across a FCL module using solid insulation barriers to partition or divide the nitrogen gas or liquid nitrogen dielectric provides shorter/narrower gas or liquid insulation gaps, which are known to have higher dielectric strength compared to one large gap.

While only certain features of the invention have been illustrated and described herein, many modifications and changes will occur to those skilled in the art. It is, therefore, to be understood that the appended claims are intended to cover all such modifications and changes as fall within the true spirit of the invention. In addition, when describing the present invention, nitrogen, in liquid and gaseous phase, was mentioned as a cryogenic medium. It is also to be understood that other cryogens can be used in place of nitrogen in the cryogenic cooling system of present invention.

The invention claimed is:

1. A fault current limiter module in the insulation region of a cryogenic cooling system having at least one fault current limiter set, the apparatus comprising:
    a first corona shield disposed along the top portion of said at least one fault current limiter set and electrically coupled to said at least one fault current limiter set;
    a second corona shield disposed along the bottom portion of said at least one fault current limiter set and electrically coupled to said at least one fault current limiter set;
    wherein said first corona shield and said second corona shield act together to reduce the electric field surrounding said at least one fault current limiter set when voltage is applied to said at least one fault current limiter set.

2. The fault current limiter module, as recited in claim 1, wherein said first corona sheild has a surface area that extends beyond the area defined by the ends of all fault current limiters within said module.

3. The fault current limiter module, as recited in claim 1, wherein said fault current limiter comprises a superconducting element electrically coupled in parallel with a shunt coil.

4. The fault current limiter module, as recited in claim 3, wherein said fault current limiter further comprises a trigger coil electrically coupled in parallel with said superconducting element.

5. The fault current limiter module, as recited in claim 1, wherein the fault current limiter module is disposed within a cryogenic liquid bath.

6. A high voltage fault current limiter system comprising:
    at least one fault current limiter module comprising at least one corona shield disposed along the top portion and bottom of said at least one fault current limiter set and electrically coupled to said at least one fault current limiter set and an insulation barrier disposed along at least one side of said at least one fault current limiter set, wherein said at least one corona shield acts to reduce the electric field surrounding said at least one fault current limiter set when voltage is applied to said at least one fault current limiter module.

7. The high voltage fault current limiter system, as recited in claim 6, wherein a bottom corona sheild is coupled to adjacent fault current limiter modules disposed along the bottom of the cryogenic cooling system and is electrically coupled in series between two fault current limiter modules.

8. The high voltage fault current limiter system, as recited in claim 6, wherein said bottom corona shield has a surface area that is nearly equal and alternatively extends beyond the area defined by the ends of all the adjacent fault current limiter modules disposed along the bottom of the high voltage fault current limiter system.

9. The high voltage fault current limiter system, as recited in claim 6, wherein said at least one fault current limiter comprises a superconducing element electrically coupled in parallel with a shunt coil.

10. The high voltage fault current limiter system, as recited in claim 9, wherein said fault current limiter further comprises a trigger coil electrically coupled in parallel with said superconducting element.

11. A high temperature superconductor module in the insulation region of a cryogenic cooling system having at least one HTS device, the apparatus comprising:
    a first corona shield disposed along the top portion of said at least one HTS device and electrically coupled to said at least one HTS device;
    a second corona shield disposed along the bottom portion of said at least one HTS device and electrically coupled to said at least one HTS device; and
    an insulation barrier disposed within the insulation region along at least one side of said at least one HTS device;
    wherein said first corona shield and said second corona shield act together to reduce the electric field surrounding said at least one HTS device when voltage is applied to said at least one HTS device.

12. The fault current limiter module, as recited in claim 11, wherein said at least one HTS device is disposed within a cryogenic liquid bath.

13. A high temperature superconductor module, in the insulation region of a cryogenic cooling system having at least one HTS device, the apparatus comprising:
    a first corona shield disposed along the top portion of said at least one HTS device and electrically coupled to said at least one HTS device;
    a second corona shield disposed along the bottom portion of to at least one HTS device and electrically coupled to said at least one HTS device; and
    an insulation barrier disposed within the insulation region along at least one side of said at least one HTS device;
    wherein said first corona sheild has a surface area that is nearly equal and alternatively extends beyond the area defined by the ends of all HTS devices within said high temperature superconductor module.

14. The fault current limiter module, as recited in claim 13, wherein said at least one HTS device is disposed within a cryogenic liquid bath.

15. A high voltage fault current limiter system comprising:
   at least one fault current limiter module comprising at least one corona shield disposed along the top set portion and bottom of said at least one fault current limiter set and electrically coupled to said at least one fault current limiter set and an insulation barrier disposed along at least one side of said at least one fault current limiter set, wherein said at least one corona shield acts to reduce the electrical field surrounding said at least one fault current limiter set when voltage is applied to said high voltage fault current limiter system;
   wherein a bottom corona sheild is coupled to adjacent fault current limiter modules disposed along the bottom of the high voltage current limiter system and wherein said bottom corona shield is electrically coupled in series between two fault current limiter modules.

16. The high voltage fault current limiter system, as recited in claim 15, wherein said bottom corona shield has a surface area that is nearly equal and alternatively extends beyond the area defined by the ends of all the adjacent fault current limiter modules disposed along the bottom of the high temperature fault current limiter system.

17. The high voltage fault current limiter system, as recited in claim 15, wherein said at least one fault current limiter set comprises a superconducing element electrically coupled in parallel with a shunt coil.

18. The high voltage fault current limiter system, as recited in claim 17, wherein said at least one fault current limiter set further comprises a trigger coil electrically coupled in parallel with said superconducting element.

* * * * *